United States Patent [19]
Hoshi

[11] Patent Number: 5,903,023
[45] Date of Patent: May 11, 1999

[54] SEMICONDUCTOR DEVICE, METHOD OF FABRICATING THE SAME, AND SPUTTERING APPARATUS

[75] Inventor: Shinichi Hoshi, Tokyo, Japan

[73] Assignee: Oki Electric Industry Co., Ltd., Tokyo, Japan

[21] Appl. No.: 08/800,219

[22] Filed: Feb. 12, 1997

[30] Foreign Application Priority Data

Oct. 9, 1996 [JP] Japan .................................. 8-268151

[51] Int. Cl.⁶ .......................... H01L 27/108; H01L 29/76
[52] U.S. Cl. .......................... 257/300; 257/296; 257/310; 257/595
[58] Field of Search .................. 257/296, 300, 257/310, 595

[56] References Cited

U.S. PATENT DOCUMENTS 5,266,820  11/1993  Van Berkel ............................ 257/300
5,406,122   4/1995  Wong et al. ........................... 257/753

OTHER PUBLICATIONS

"Gallium Arsenide Processing Techniques", published in 1984 by Artech House Inc., pp. 306–314.

*Primary Examiner*—Valencia Martin-Wallace
*Attorney, Agent, or Firm*—VENABLE; Robert J. Frank; Michael A. Sartori

[57] ABSTRACT

A method of fabricating a semiconductor device comprises the steps of: (a) forming a mask layer over an upper surface of a semiconductor substrate such that the mask layer has an aperture penetrating the mask layer and having an inclined lateral wall so as to make the aperture inverted taper shaped; (b) forming a first dielectric layer at a first area over the upper surface of the semiconductor substrate within the aperture by sputtering at a first sputtering incidence direction; and (c) forming a first electrode layer at a second area over the upper surface of the semiconductor substrate within the aperture by sputtering at a second sputtering incidence direction which is different from the first sputtering incidence direction.

12 Claims, 8 Drawing Sheets

SEMICONDUCTOR DEVICE, METHOD OF FABRICATING THE SAME, AND SPUTTERING APPARATUS

BACKGROUND OF THE INVENTION

The present invention relates to a semiconductor device having a semiconductor substrate such as a GaAs substrate and a capacitor formed thereon, a method of fabricating it, and a sputtering apparatus suited to this fabrication method.

Conventional capacitors known in the art include, for example, MIM (Metal-Insulator-Metal) capacitors wherein a dielectric material is sandwiched between two metal electrodes and Schottky capacitors which use Schottky barrier capacitance.

The capacitance C of a MIM capacitor may be expressed in terms of the following equation, where $\epsilon_0$ denotes a dielectric constant of vacuum, $\epsilon_r$ denotes a dielectric constant of the dielectric material, S denotes a surface area of the capacitor, and d denotes a distance between the electrodes.

$$C = \epsilon_0 \epsilon_r (S/d)$$

To fabricate a capacitor of high capacitance, a dielectric material of high dielectric constant $\epsilon_r$ may be used, the distance d between the electrodes may be reduced, or the capacitor surface area S may be increased. However, as the use of dielectric materials of high dielectric constant is limited to certain materials, and as there is also a limit to the extent to which the distance d between the electrodes can be reduced, the chosen method is usually to increase the surface area S of the capacitor.

However, attempts to increase the surface area S of the capacitor led to an increase of chip surface area, and this directly results in higher unit costs for chips.

SUMMARY OF THE INVENTION

It is an object of the present invention to provide a semiconductor device having a high capacitance capacitor having a small surface area, to provide a method of efficiently fabricating such a semiconductor device, and to provide a sputtering apparatus suitable for this fabrication method.

According to one aspect of the present invention, a method of fabricating a semiconductor device comprises the steps of: (a) forming a mask layer over an upper surface of a semiconductor substrate such that the mask layer has an aperture penetrating the mask layer and having an inclined lateral wall so as to make the aperture inverted taper shaped; (b) forming a first dielectric layer at a first area over the upper surface of the semiconductor substrate within the aperture by sputtering at a first sputtering incidence direction; and (c) forming a first electrode layer at a second area over the upper surface of the semiconductor substrate within the aperture by sputtering at a second sputtering incidence direction which is different from the first sputtering incidence direction.

This method may further comprises the steps of: (f) forming a second dielectric layer at a third area over the upper surface of the semiconductor substrate within the aperture by sputtering at a third sputtering incidence direction; and (g) forming a third electrode layer at a fourth area over the upper surface of the semiconductor substrate within the aperture by sputtering at a fourth sputtering incidence direction which is different from the first to third sputtering incidence directions.

Further, in this method, the steps (b), (c), (f) and (g) may be repeated in this order at desired times.

According to another aspect of the present invention, a semiconductor device wherein a capacitor is formed on a chemical compound semiconductor substrate, wherein the capacitor comprises: a first electrode layer; a dielectric layer formed on the first electrode layer; and a second electrode layer formed on the dielectric layer.

According to further aspect of the present invention, a sputtering apparatus comprises: a sputtering chamber; a wafer stage on which a wafer is set; and a target stage on which a sputtering material is set. The wafer stage and the target stage is installed in the sputtering chamber. The wafer stage comprises: a fixed stage fixed to the sputtering chamber; and a movable wafer holder holding the wafer and being free to rotate on the fixed stage, thereby making a sputtering incidence direction a desired direction.

According to still further aspect of the present invention, a sputtering apparatus comprises: a sputtering chamber; a wafer stage on which a wafer is set; and a plurality of target stages on which a sputtering material is set respectively. The wafer stage and the target stages is installed in the sputtering chamber, and the target stages is disposed in positions at which sputtering incidence directions with respect to an upper surface of the wafer are mutually different. A sputtering material set on one of the target stages is deposited over the wafer by applying a high frequency voltage between the wafer stage and the one of the target stage, thereby depositing the sputtering material over the upper surface of the wafer.

BRIEF DESCRIPTION OF THE INVENTION

The present invention will become more fully understood from the detailed description given hereinbelow and the accompanying drawings which are given by way of illustration only, and thus are not limitative of the present invention, and wherein:

FIGS. 6F–6J are cross-sectional views taken along lines 6F—6F, 6G—6G, 6H—6H, 6I—6I, and 6J—6J shown in FIGS. 6A–6E;

DETAILED DESCRIPTION OF THE INVENTION

Preferred embodiments of the present invention will be described with reference to the accompanying drawings.
First Embodiment FIG. 1A is a circuit diagram of a semiconductor device according to a first embodiment of the present invention, FIG. 1B partially shows an upper surface of the semiconductor device of FIG. 1A, and FIG. 1C is a cross-section taken along a line A—A' in FIG. 1B.

This semiconductor device includes a gallium arsenide (GaAs) substrate 10.

Figure 1A:
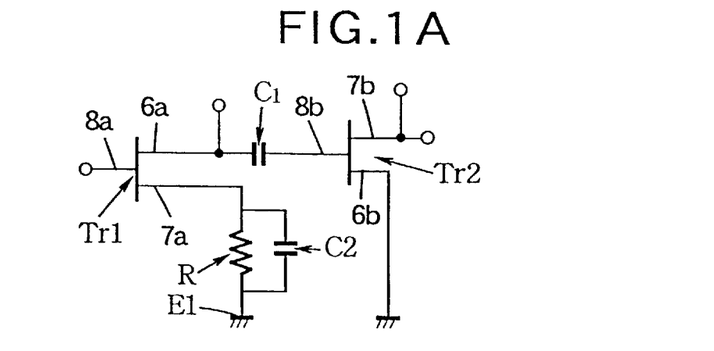
FIG. 1A is a circuit diagram of a semiconductor device according to a first embodiment of the present invention.

The circuit shown in FIG. 1A includes N channel metal semiconductor ("MES") type transistors Tr1 and Tr2, capacitors C1 and C2, and a resistance R. The capacitor C1 is used as a condenser to cut out the D.C. component between the drain electrode 6a of the transistor Tr1 and the gate electrode 8b of the transistor Tr2. The capacitor C2 is also provided in parallel with a bias resistance R between the source electrode 7a of the transistor Tr1 and a grounded power supply E1, and is used as a bypass capacitor.

Figure 1B:
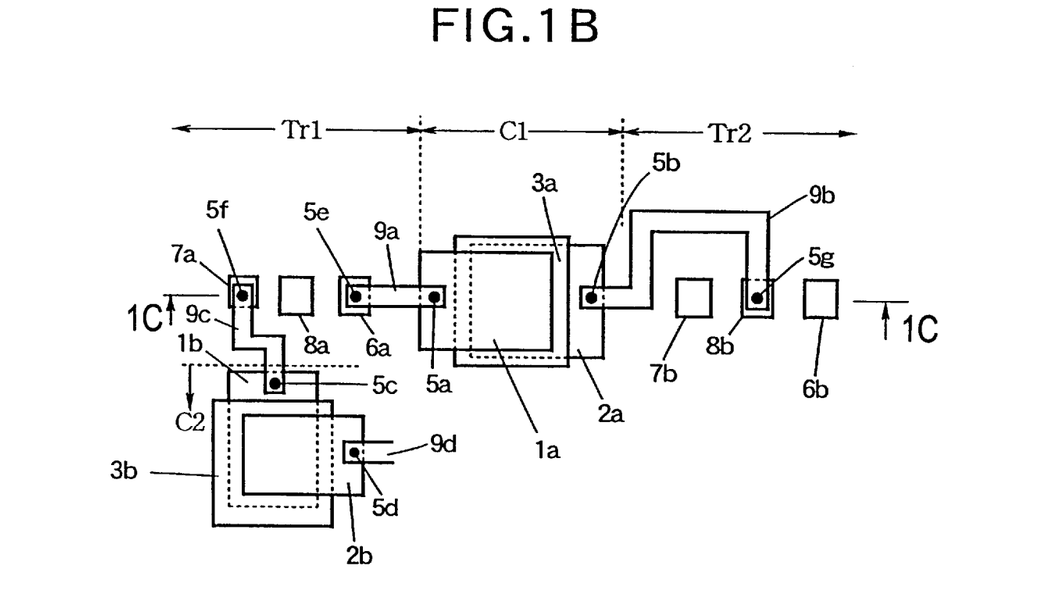
FIG. 1B partially shows an upper surface of the semiconductor device of FIG. 1A.
Figure 1C:
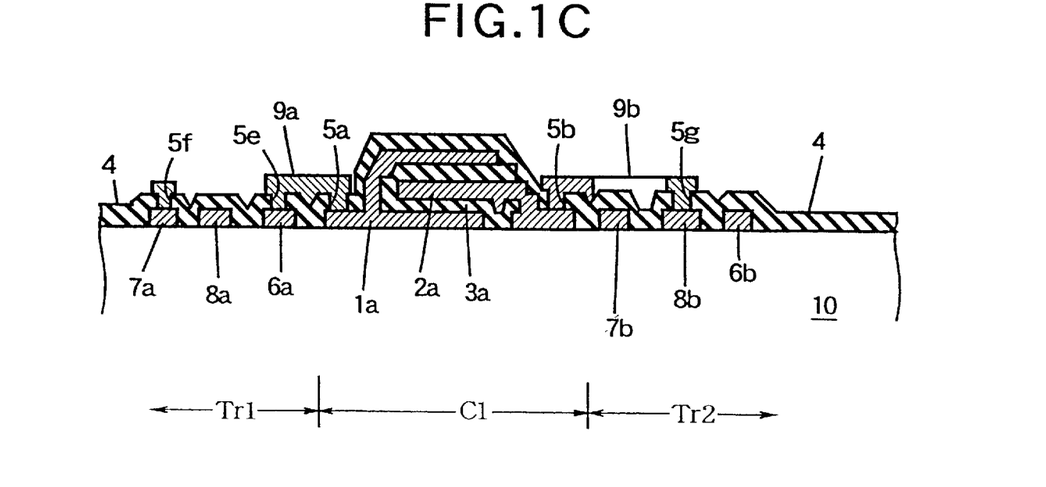
FIG. 1C is a cross-sectional view taken along line 1C—1C in FIG. 1B.

Referring to FIGS. 1B and 1C, the transistors Tr1 and Tr2 and the capacitors C1 and C2 are formed on the GaAs substrate 10. It will be understood that the resistance R is also formed on the GaAs substrate 10, however its pattern is not shown in FIGS. 1B and 1C. The capacitor C1 is a MIM capacitor of laminated construction formed by sandwiching a dielectric 3a between a first electrode 1a and a second electrode 2a. The capacitor C2 is a MIM capacitor of laminated construction formed by sandwiching a dielectric 3b between a first electrode 1b and a second electrode 2b.

A contact hole 5a to the first electrode 1a of the capacitor C1, a contact hole 5b to the second electrode 2a of the capacitor C1, a contact hole 5c to the first electrode 1b of the capacitor C2, a contact hole 5d to the second electrode 2b of the capacitor C2, a contact hole 5e to a drain electrode 6a of the transistor Tr1, a contact hole 5f to a source electrode 7a of the transistor Tr1, and a contact hole 5g to a gate electrode 8b of the transistor Tr2, are formed in an inter-layer insulating film 4. The first electrode 1a of the capacitor C1 and the drain electrode 6a of the transistor Tr1 are connected via the contact holes 5a and 5e by a metal wiring 9a. The second electrode 2a of the capacitor C1 and the gate electrode 8b of the transistor Tr2 are connected via the contact holes 5b and 5g by a metal wiring 9b. The first electrode 1b of the capacitor C2 and the source electrode 7a of the transistor Tr1 are connected via the contact holes 5c and 5f by a metal wiring 9c. The second electrode 2b of the capacitor C2 is connected to the grounded power supply (not shown) by a metal wiring 9d. The sectional construction of the capacitor C2 is the same as that of the capacitor C1 shown in FIG. 1C.

Next, a description of the sputtering apparatus used for the process for forming the capacitors will be given.

Figure 2:
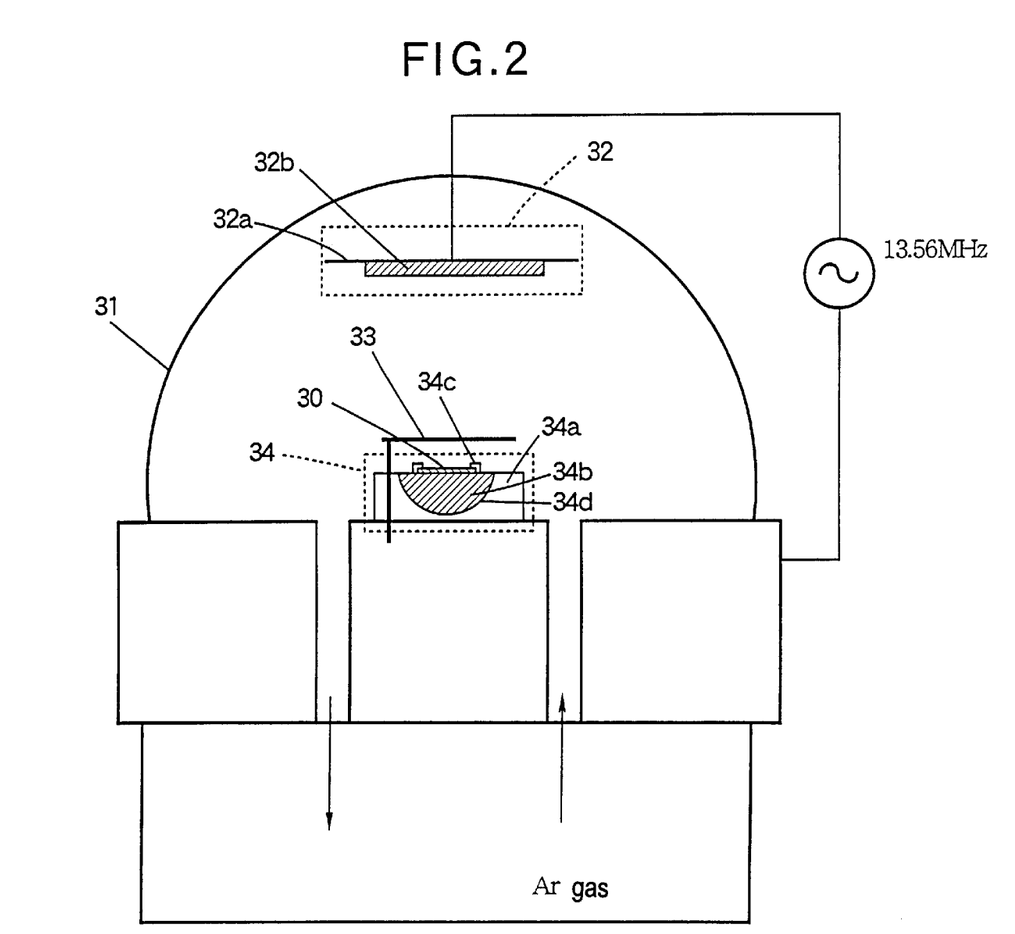
FIG. 2 is a structural diagram of a sputtering apparatus used in a process for forming a capacitor according to the present invention.

FIG. 2 is a diagram showing the construction of a sputtering apparatus used in forming the capacitors. In this sputtering apparatus, sputtering can be performed at a variable, oblique incidence direction to a wafer surface (referred to hereafter as "oblique sputtering" as distinct from ordinary "vertical sputtering" where the incidence angle is perpendicular to the wafer surface). The sputtering apparatus shown in FIG. 2 includes a target 32, a wafer shutter 33 and a wafer stage 34 inside a chamber 31. The target 32 includes a target stage 32a on which a sputtering material 32b is set.

Figure 3A:
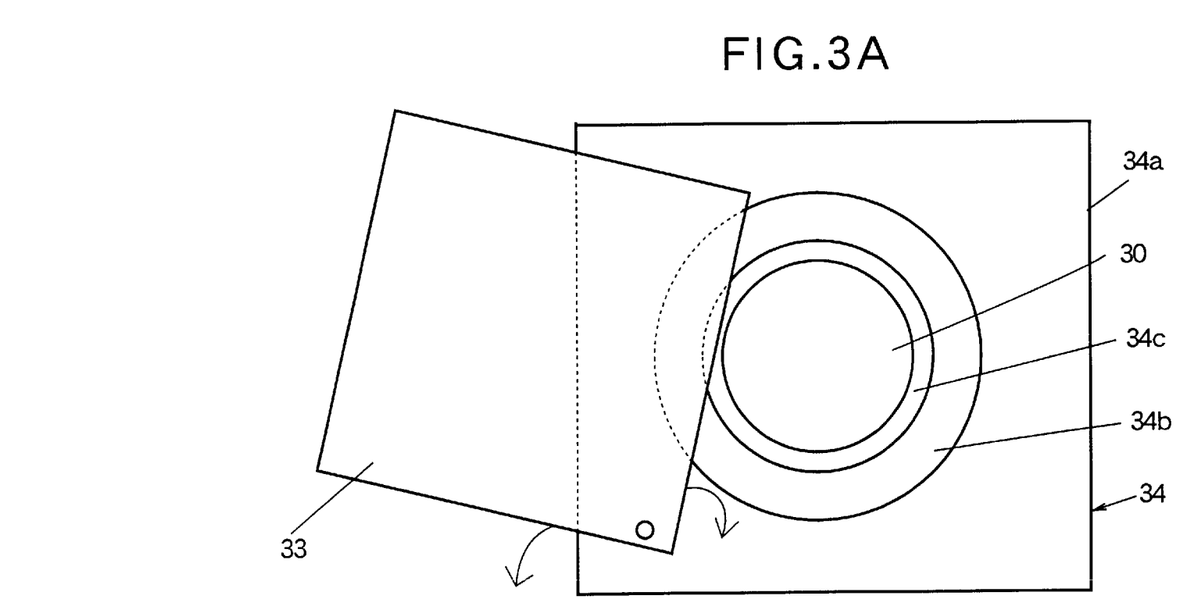
FIG. 3A is an enlarged view showing an upper surface of a wafer stage in the sputtering apparatus of FIG. 2.
Figure 3B:
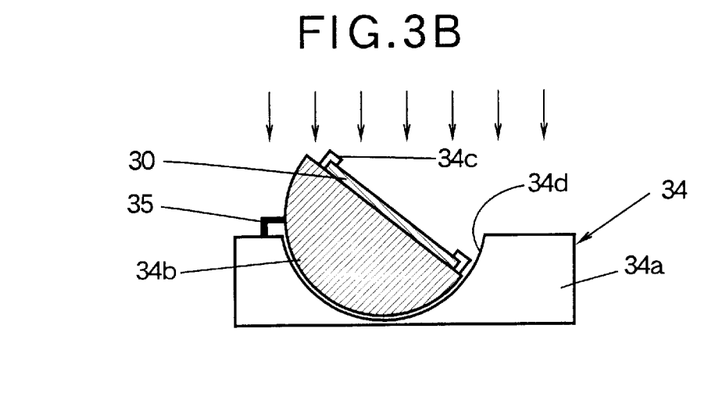
FIG. 3B is an enlarged view showing a longitudinal cross-section of the wafer stage in the sputtering apparatus of FIG. 2.

FIG. 3A is an enlarged view showing an upper surface of the wafer stage 34 in the sputtering apparatus of FIG. 2, and FIG. 3B is an enlarged view in section of the wafer stage in the sputtering apparatus of FIG. 2. Referring to FIGS. 3A and 3B, the wafer stage 34 includes a fixed stage 34a, on the upper surface of which a hemispherical depression 34d is formed and which is fixed to the chamber 31, a movable wafer holder 34b having a hemispherical projection which engages with the depression 34d of the fixed stage 34a, and a wafer fixing ring 34c provided on and fixed to a flat surface of the movable wafer holder 34b. A wafer 30 is fixed to the flat surface of the movable wafer holder 34b by the wafer fixing ring 34c. The movable wafer holder 34b is fixed to the fixed stage 34a by a fixing pin 35 such that a sputtering incidence direction with respect to the upper surface of the wafer 30 is a desired direction.

Figure 4A:
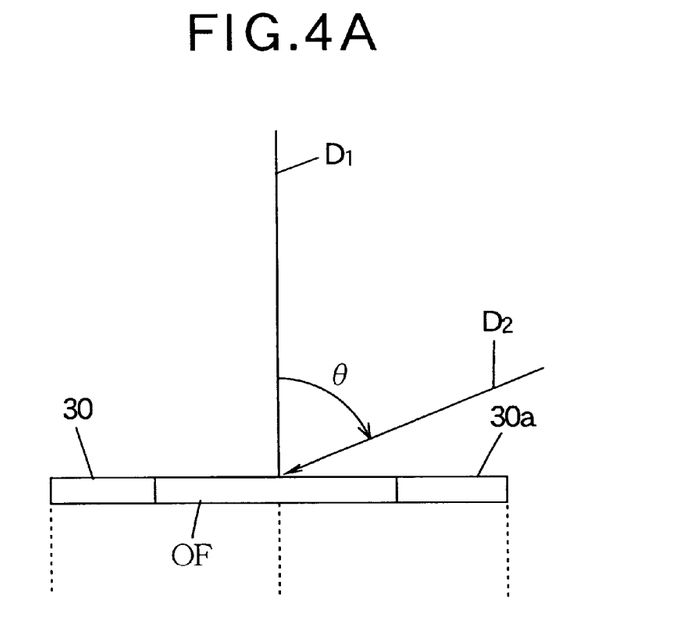
FIGS. 4A and 4B are diagrams for describing how a sputtering incidence direction is defined by a sputtering incidence angle $\theta$ and a sputtering orientation angle $\phi$.
Figure 4B:
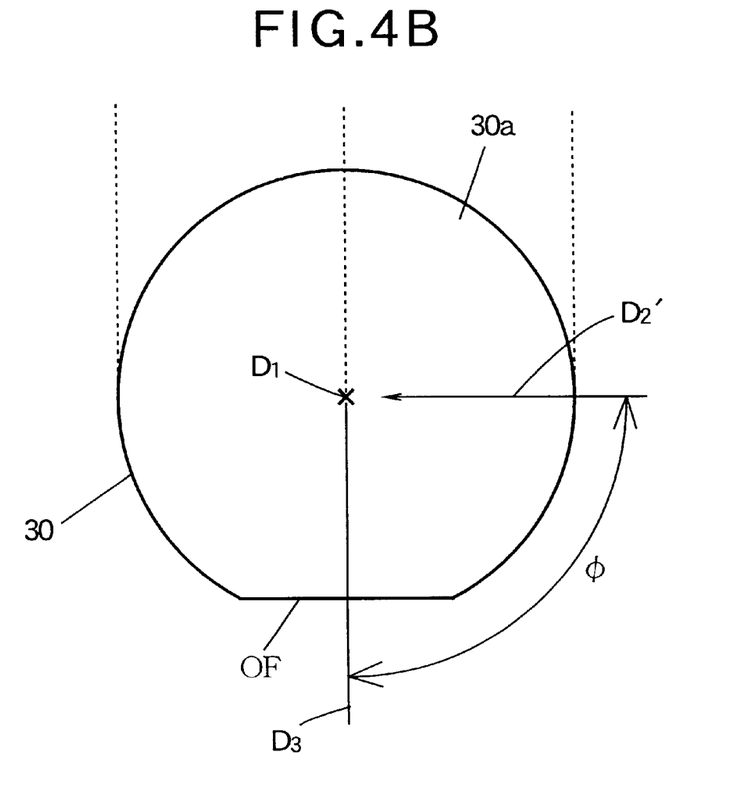

FIGS. 4A and 4B are side and plan views of the wafer 30 for describing the sputtering incidence direction D2 relative to the wafer surface 30a. In FIGS. 4A and 4B, the sputtering incidence direction D2 is defined by a sputtering incidence angle θ and a sputtering orientation angel φ, where the sputtering incidence angle θ denotes an angle between the normal line D1 perpendicular to the wafer surface 30a and the sputtering incidence direction D2, and the sputtering orientation angel φ denotes an angle between a direction D3 from the center of the wafer 30 to an orientation flat (OF) (referred to hereinafter as the OF direction) and a direction D2' obtained by projecting the direction D2 on the upper surface by a light ray parallel to the normal line D1 (i.e., an angle formed by a counterclockwise rotation from the OF direction). In the sputtering apparatus shown in FIG. 2, the sputtering orientation angel θ can be varied from 0 degrees to 90 degrees, and the sputtering orientation angel φ can be varied from 0 degrees to 360 degrees.

In the sputtering apparatus shown in FIG. 2 and FIGS. 3A and 3B, the sputtering material 32b is set on the target stage 32a, the wafer 30 is set in the movable wafer holder 34b by the wafer fixing ring 34c, and the movable wafer holder 34b is fixed at a predetermined angle using the fixing pin 35. The sputtering material 32b then is deposited by the oblique sputtering or vertical sputtering on the upper surface 30a of the wafer 30 under a predetermined vacuum (e.g., $10^{-1}$ torr to 10 torr), supplying (Ar) gas at a predetermined flowrate (e.g., 1 sccm to 30 sccm) to the chamber 31, and applying a radio frequency (RF); voltage of 13.56 MHz between the target stage 32a and the movable wafer holder 34b.

Figure 5:
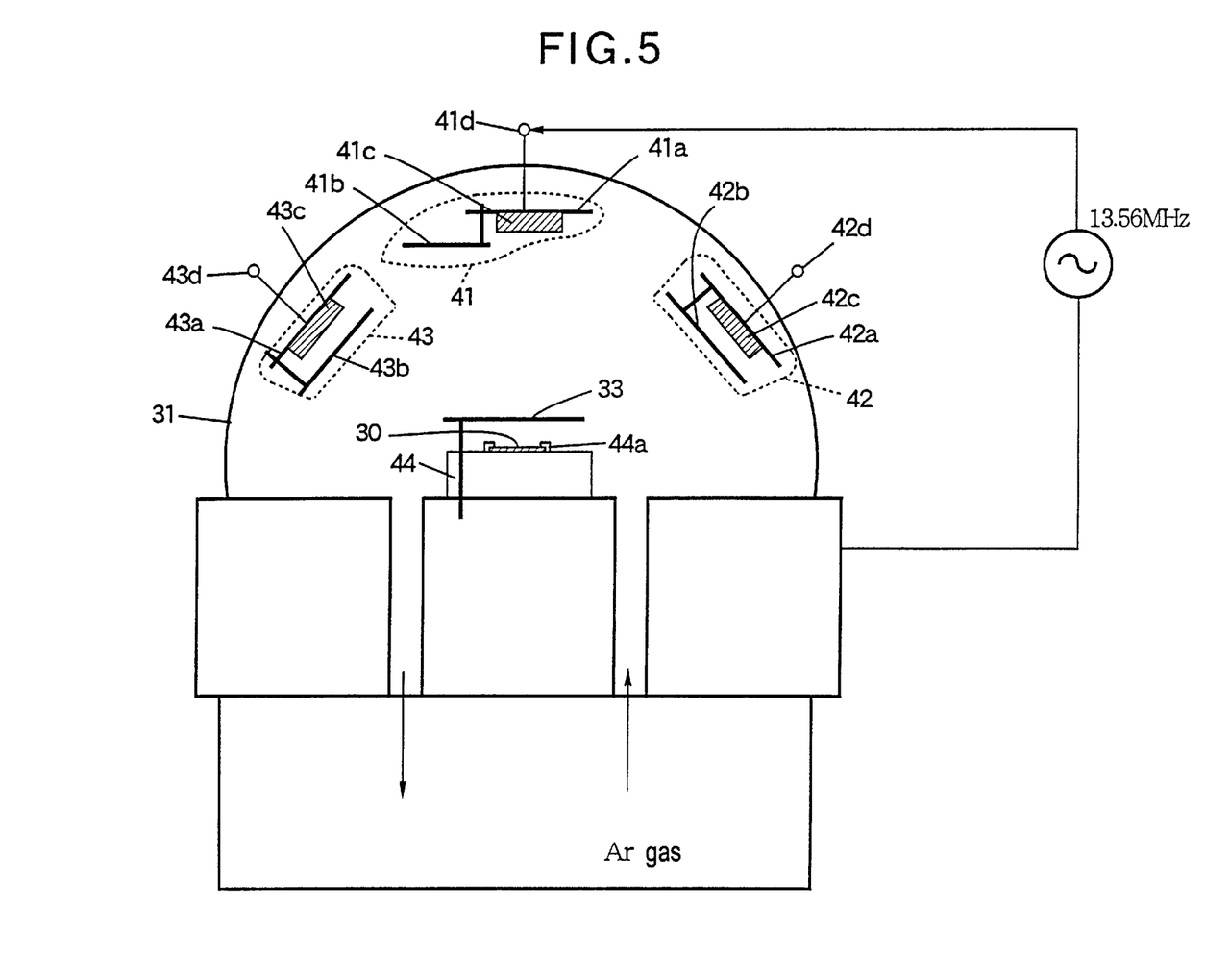
FIG. 5 is a structural diagram of another type of sputtering apparatus used in a process for forming a capacitor according to the present invention.

FIG. 5 is a schematic diagram of a different type of sputtering apparatus used in forming the capacitors. This is a sputtering apparatus which can change a sputtering incidence direction for allowing oblique sputtering to be performed. The sputtering apparatus shown in FIG. 5 has three targets 41, 42 and 43, a wafer shutter 33 and a wafer stage 44 inside the chamber 31.

The three targets 41, 42 and 43 respectively includes target stages 41a, 42a and 43a, and target shutters 41b, 42b and 43b. The wafer 30 is fixed to the surface of the wafer stage 44 by a wafer fixing ring 44a provided in the wafer stage 44. The three target stages 41a, 42a and 43a are set in positions such that the sputtering incidence angle θ and the sputtering orientation angle φ (see FIGS. 4A and 4B) have mutually different values. For example, the target stage 41a is set in a position where θ=0 degrees, the target stage 42a is set in a position where θ=10 degrees–30 degrees and φ=90 degrees, and the target stage 43a is set in a position where θ=10 degrees to 30 degrees and φ=270 degrees.

In the sputtering apparatus of FIG. 5, a sputtering material 41c is set on the target stage 41a, a sputtering material 42c is set on the target stage 42a, a sputtering material 43c is set on the target stage 43a, and a wafer 30 is set on the wafer stage 44. When the target stage 41a is used for example, the target shutter 41b and the wafer shutter 33 are opened, and the sputtering material 41c is deposited by the vertical sputtering on the upper surface of the wafer 30 under a predetermined vacuum (e.g., $10^{-1}$ torr to 10), while supplying Ar gas at a predetermined flowrate to the chamber 31, and while applying an RF voltage of 13.56 MHz between a terminal 41d of the target stage 41a and the wafer stage 44. The target stages 42a and 43a are positively charged to avoid attracting ions, e.g. from the sputtering materials, and the shutters 42b and 43b are closed so that sputtering material 41c from the target 41 does not adhere to the sputtering materials 42c and 43c. When the target 42 is used, the target shutter 42b and the wafer shutter 33 are opened, the target stages 41a and 43a are positively charged, the target shutters 41b and 43b are closed, an RF voltage is applied between a terminal 42d of the target stage 42a and the wafer stage 44, and sputtering by the sputtering material 42c is performed obliquely to the surface of the wafer 30. The sputtering apparatus shown in FIG. 2 or FIG. 5 may also be a multi-chamber type including a plurality of chambers shown in FIG. 2 if necessary.

FIGS. 6A–6J are diagrams showing a process for fabricating a capacitor according to the first embodiment, wherein FIGS. 6A–6E respectively show upper surfaces, and FIGS. 6F–6J respectively show sections taken along the lines 6F—6F, 6G—6G, 6H—6H, 6I—6I, and 6J—6J in FIGS. 6A–6E. In the capacitor forming process shown in FIGS. 6A–6J, a mask layer 13 (namely, resist pattern 13) is formed on the GaAs substrate 10 (namely, GaAs wafer 30) on which a first metal electrode layer 11 and a lower metal electrode layer 12 are formed. The mask layer 13 is formed using a photoresist of which the pattern edges have an inverted taper shape. A first dielectric layer 14, a second metal electrode layer 15, a second dielectric layer 16 and a third metal electrode layer 17 are formed by the different sputtering incidence directions. The OF of the wafer 30 is assumed to be in the lower part of FIGS. 6A–6E, and in front of the paper surface in the case of FIGS. 6F–6J.

Figure 6A:
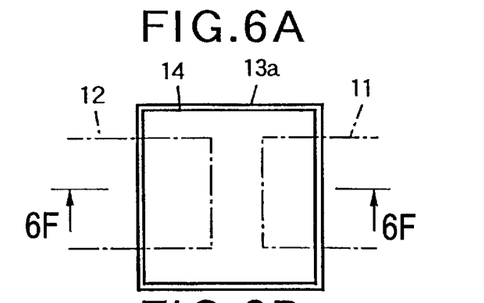
FIGS. 6–6E are views of an upper surface at each step of the capacitor forming process according to the first embodiment.
Figure 6B:
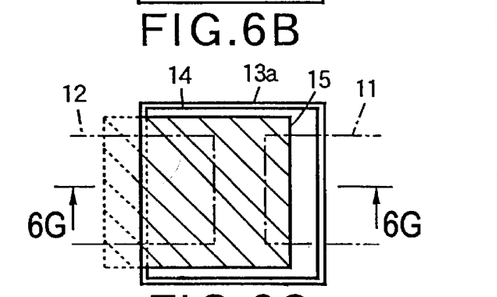
Figure 6C:
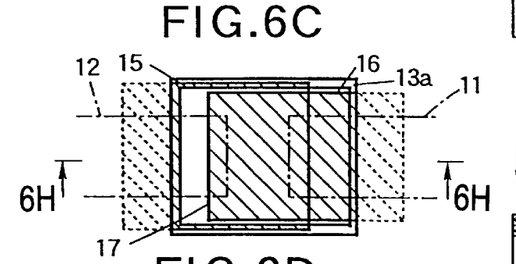
Figure 6D:
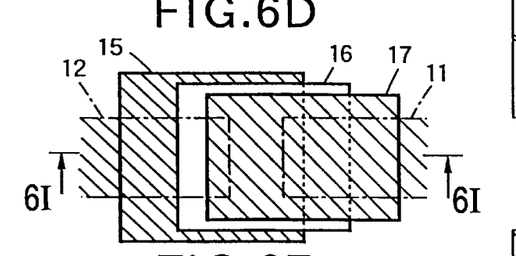
Figure 6E:
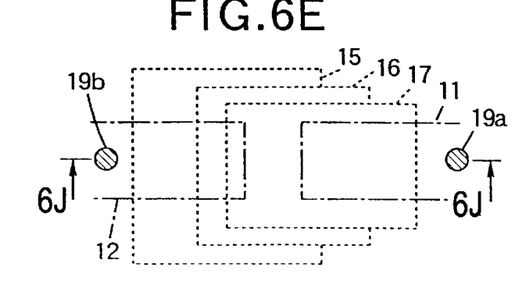
Figure 6F:
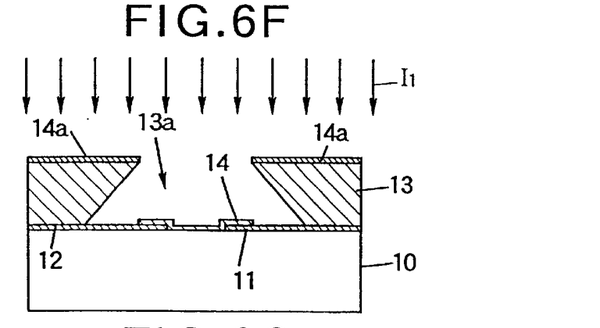

In FIG. 6A and FIG. 6F, a first metal electrode layer 11 and the lower metal electrode layer 12 which are electrically isolated from each other are formed on a surface of the GaAs substrate 10. The first metal electrode layer 11 and the lower metal electrode layer 12 are formed, for example, by forming a metal film, by sputtering or a similar process, over the entire surface of the GaAs substrate 10, and then patterning (namely, etching) the metal layer, or by forming a metal layer film on the surface of the GaAs substrate 10 on which a photoresist pattern has been formed, and then dissolving the resist pattern to remove it. The GaAs substrate 10 used herein may be a low dope 3 inch wafer having an impurity concentration of, for example, $10^{14}$ cm$^{-3}$ or a non-doped 3 inch wafer.

Next, a resist pattern 13 as a mask layer having an aperture 13a is formed by patterning using a photoresist (not shown in the figure) of which the pattern edges have an inverted taper shape. The aperture 13a contains an area for forming the first metal electrode 11 and an area for forming the lower metal electrode layer 12. It is preferred that the taper angle of the edges of the mask layer 13 subtend an angle of 10 degrees to 40 degrees at the upper surface of the substrate 10 (i.e., wafer surface). The photoresist for forming the resist pattern 13 may, for example, be a negative type photoresist (for example, the brandname FSMR photoresist).

Next, a dielectric film 14 of a predetermined thickness (e.g., 9000 Å–1500 Å is formed by vertical sputtering (sputtering incidence angle θ=0 degrees) on the surface of the substrate 10 on which the resist pattern as a mask layer 13 was formed. In FIG. 6F, a sputtering incident direction is indicated by arrows $I_1$. The resist pattern 13 acts as a mask to form this first dielectric film 14 which overlaps with a part of the first metal electrode layer 11 and a part of the lower metal electrode layer 12.

The aforesaid dielectric film 14 may be, for example, a ferroelectric film such as silicon nitride (SiN), tantalum oxide ($Ta_2O_5$), BST (amorphous film consisting of barium, strontium, titanium and oxygen), or STO (amorphous film consisting of strontium, titanium and oxygen). The dielectric film 14a is also formed on the surface of the resist pattern 13.

Figure 6G:
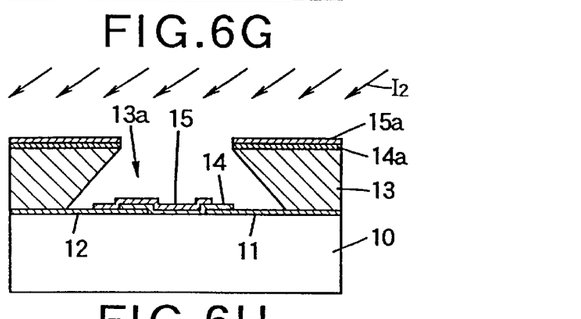

Next, in FIG. 6B and FIG. 6G, a metal layer 15 is formed by oblique sputtering where the sputtering angles θ=10 degrees to 30 degrees and φ=90 degrees. In FIG. 6G, a sputtering incident direction is indicated by arrows $I_2$. This second metal electrode layer 15 is formed in the aperture 13a with the resist pattern 13 acting as a mask. The second metal electrode layer 15 overlaps with most of the surface of the first dielectric layer 14 (except for a part of the layer 14 adjacent to the first metal electrode layer 11) and with a part of the exposed surface of the lower metal electrode layer 12, but does not overlap with the exposed surface of the first metal electrode layer 11. The second metal electrode layer 15 is therefore in contact with the lower metal electrode layer 12, but is electrically isolated from the first metal electrode layer 11.

The first metal electrode layer 11, the lower metal electrode layer 12 and the second metal electrode layer 15 may be formed, for example, of two metal layers, titanium (Ti) and platinum (Pt) (referred to hereafter as "Ti/Pt metal"). The Ti layer has a thickness of 500 Å, and the Pt layer of a thickness of 1000Å is formed on the Ti layer. Pt also acts as a flat plate capacitor electrode, and prevents crystal mixing with the dielectric film when the dielectric film immediately above is formed by sputtering. In forming the aforesaid Ti/Pt metal, a sputtering apparatus having a multi-chamber specification may be used for the sputtering as shown in FIG. 2 or FIG. 5. It should be noted that the metal electrode layer 15a is also formed on the surface of the dielectric layer 14a.

Figure 6H:
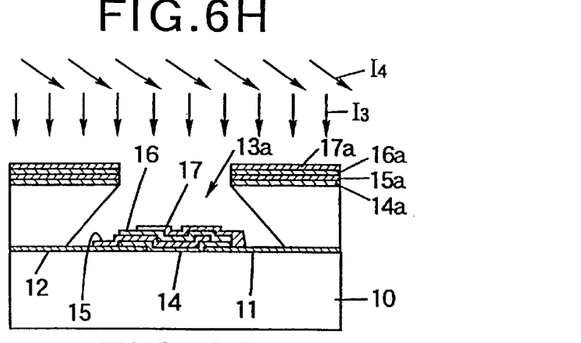

Next, in FIG. 6C and FIG. 6H, a second dielectric layer 16 is formed by vertical sputtering. In FIG. 6H, a sputtering incident direction is indicated by arrows $I_3$. This second dielectric layer 16 is formed in the aperture 13a. The second dielectric layer 16 overlaps with most of the surface of the second metal layer 15 (except for a part of the layer 15 adjacent to the lower electrode layer 12) and with the exposed surface of the first dielectric layer 14. It shall be assumed that this second dielectric layer 16 is of the same dielectric material as the first dielectric layer 14 and has the same film thickness. It should be noted that the dielectric layer 16a is also formed on the surface of the metal layer 15a.

Next, a metal electrode layer 17 is formed by oblique sputtering where the sputtering angles θ=10 degrees to 30 degrees and φ=270 degrees. In FIG. 6G, a sputtering incident direction is indicated by arrows $I_4$. This third metal electrode layer 17 is formed in the aperture 13a. The third metal electrode layer 17 overlaps with most of the surface of the second dielectric layer 16 and with the exposed surface of the first metal electrode layer 11, but does not overlap with the exposed surfaces of the lower metal electrode layer 12 and the second metal electrode layer 15. The third metal electrode layer 17 is therefore in contact with the first metal electrode layer 11, but is electrically isolated from the lower metal electrode layer 12. It will be assumed that this third metal electrode layer 17 is of the same metal as the second metal electrode 15 and has the same thickness. It should be noted that the metal electrode layer 17a is also formed on the surface of the dielectric layer 16a.

Figure 6I:
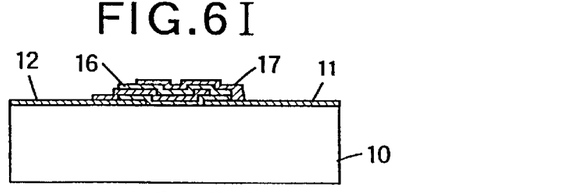

Next, in FIG. 6D and FIG. 6I, the resist pattern 13 is lifted off by dissolving it. The metal layers 15a and 17a and the dielectric layers 14a and 16a on the surface of the resist 13 are then removed together, and a capacitor having a laminated structure having the first metal electrode layer 11, the lower metal electrode layer 12, the first dielectric layer 14, the second metal electrode layer 15, the second dielectric layer 16 and the third metal electrode layer 17, is retained. When this capacitor is used as the capacitor C1 of FIG. 1, the first metal electrode layer 11 and the third metal electrode layer 17 form the first electrode 1a, the lower metal electrode layer 12 and the second metal electrode layer 15 form the second electrode 2a, and the first dielectric layer 14 and the second dielectric layer 16 form the dielectric 3a.

Figure 6J:
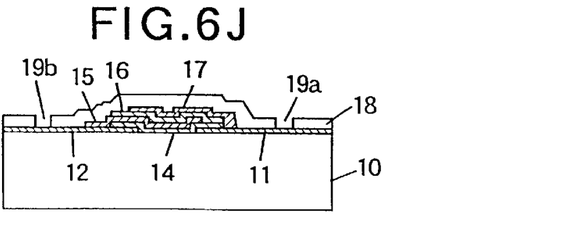

Next, in FIG. 6E and FIG. 6J, an inter-layer insulating film 18 is formed over the whole surface by plasma CVD or the like. The inter-layer insulating film 18 may be, for example, silicon nitride (SiN) film. A contact hole 19a to the first metal electrode layer 11 and a contact hole 19b to the lower metal electrode layer 12 are formed in this inter-layer insulating film 18, and connection wiring is attached through these contact holes 19a and 19b. When this capacitor is used as the capacitor C1 of FIG. 1, the contact hole 19a corresponds to the contact hole 5a and the contact hole 19b corresponds to the contact hole 5b.

Hence according to the first embodiment, by giving the capacitor a laminated structure having the third metal electrode layer and the second dielectric layer, the effective surface area S of the capacitor is increased. Specifically, the effective surface area S of the capacitor is increased by approximately 2 times relative to the pattern occupancy area. The capacitance of the capacitor is thereby increased by approximately 2 times for the same pattern occupancy area.

Further, by using the resist pattern 13 as a mask in a capacitor forming process and by varying the sputtering incidence angle in order to form each layer, the first dielectric layer 14, the second metal electrode layer 15, the second dielectric layer 16 and the third metal electrode layer 17 are sequentially formed by sputtering. It is therefore unnecessary to perform the steps of sputtering, patterning, etching, and resist removing to form each layer as when the etching method is used, hence the process is simplified, and the capacitor can be formed efficiently.

Further, by using the sputtering apparatus shown in FIG. 2 or FIG. 5, oblique sputtering can easily be performed at any desired sputtering incidence angle.

In the aforesaid first embodiment, a description was given in the case where the capacitor having 2 layers, however it will be understood that the number of layers is not limited to two. When a capacitor of n layers is formed, the effective surface area S of the capacitor may be increased by approximately n times relative to the pattern occupancy area, hence the capacitance of the capacitor will be n times the capacitance in the conventional case.

Further, the capacitor was connected to an external circuit (transistors Tr1, Tr2 in FIG. 1) by connecting the metal electrodes through the contact holes formed in the inter-layer insulation film with metal wires, however the first metal electrode layer 11 and lower metal electrode layer 12 may also be connected to an external circuit in which case the wiring step after forming the inter-layer insulation film may be omitted.

An electrically conducting area may also be formed by ion implantation or epitaxial growth techniques in the part of the surface of the GaAs semiconductor substrate 10 where it is desired to form the first metal electrode layer 11 and lower metal electrode layer 12, and this electrically conducting area used as the first metal electrode layer and lower electrode layer.

Second Embodiment

Figure 7A:
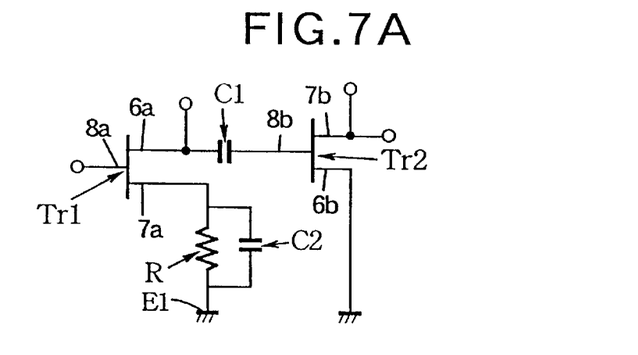
FIG. 7A is a circuit diagram of a semiconductor device according to a second embodiment of the present invention.
Figure 7B:
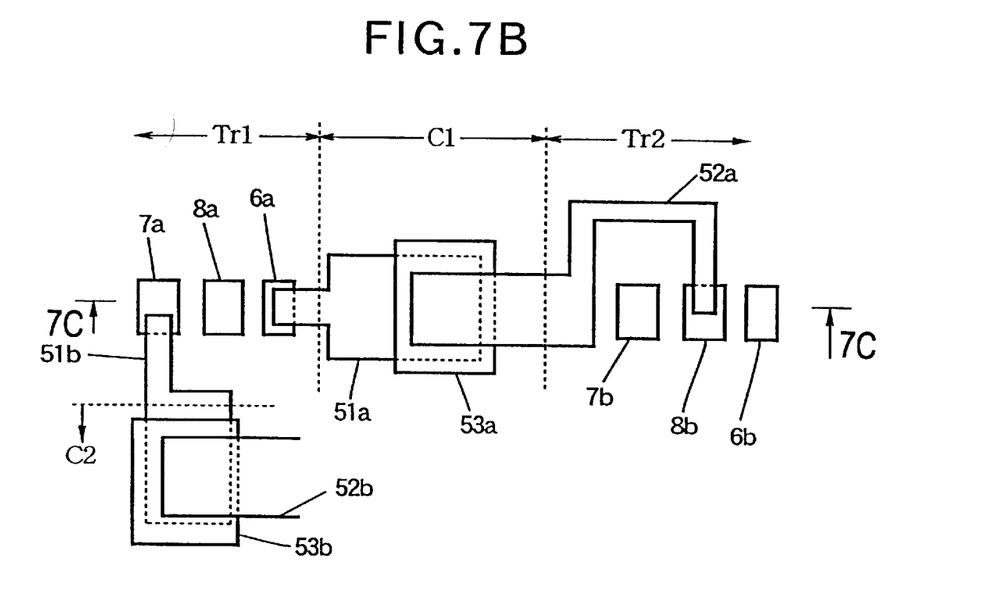
FIG. 7B partially shows an upper surface of the semiconductor device of FIG. 7A.
Figure 7C:
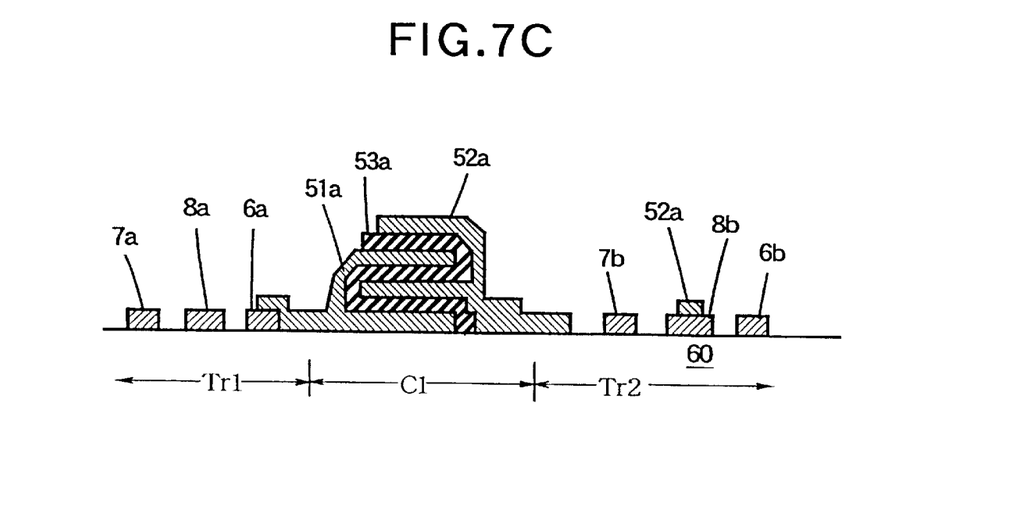
FIG. 7C is a cross-sectional view taken along line 7C—7C in FIG. 7B.

FIG. 7A is a circuit diagram of a semiconductor device according to a second embodiment of the present invention, FIG. 7B partially shows an upper surface of the semiconductor device of FIG. 7A, and FIG. 7C is a cross-sectional view taken along a line 7C—7C in FIG. 7B.

This semiconductor device uses a GaAs substrate 60. Further, FIG. 7A is the same as FIG. 1A.

In FIGS. 7B and 7C, the transistors Tr1, Tr2 and capacitors C1, C2 are formed on a GaAs substrate 60. A resistance R is also formed on the GaAs substrate 60, but its pattern diagram is not shown. The capacitor C1 is a MIM capacitor formed by sandwiching a dielectric 53a between a first electrode 51a and a second electrode 52a. The capacitor C2 is a MIM capacitor formed by sandwiching a dielectric 53b between a first electrode 51b and a second electrode 52b.

The first electrode 51a of the capacitor C1 is connected to the drain electrode 6a of the transistor Tr1, and the second electrode 52a of the capacitor C1 is connected to the gate electrode 8b of the transistor Tr2. The first electrode 51b of the capacitor C2 is connected to the source electrode 7a of the transistor Tr1, and the second electrode 52b of the capacitor C2 is connected to a grounded power supply E1 (not shown). The construction in section of the capacitor C2 is the same as that of the capacitor C1 shown in FIG. 7C.

In the capacitor C1, by applying ground potential to the first electrode 51a and a negative potential to the second electrode 52a, the side gate effect of the transistor Tr1 disappears and deterioration of the transistor output is avoided.

Next, the formation of the capacitor according to the second embodiment will be described. In this formation process, the sputtering apparatus capable of oblique sputtering shown in FIG. 2 or FIG. 5 is used as in the first embodiment.

Figure 8A:
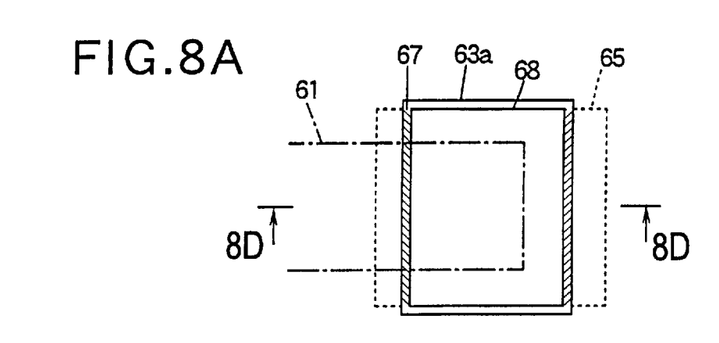
FIGS. 8A–8C are views of an upper surface at each step of the capacitor forming process according to the second embodiment.
Figure 8B:
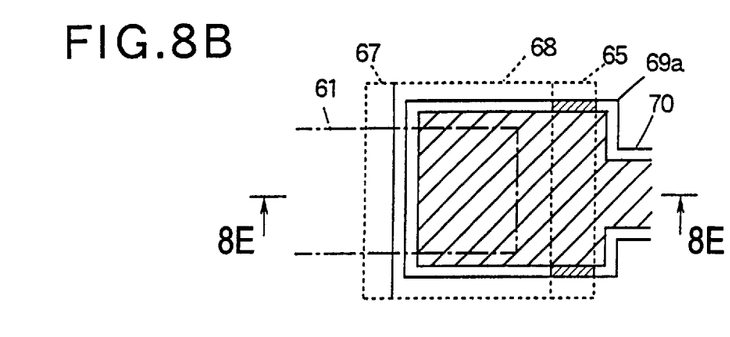
Figure 8C:
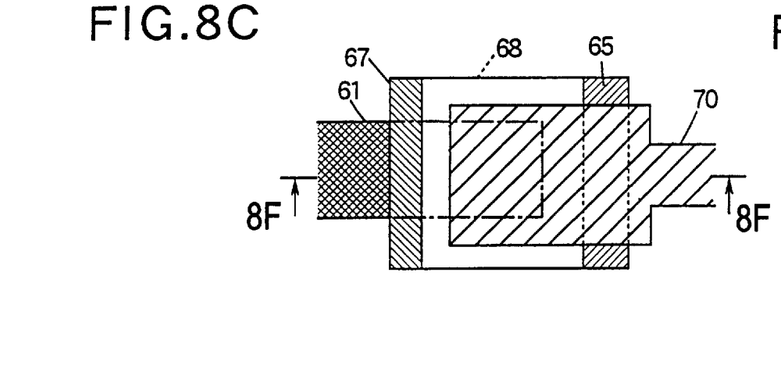
Figure 8D:
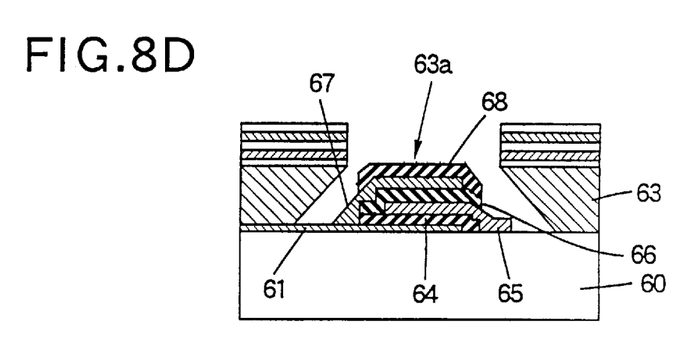
FIGS. 8D–8F are cross-sectional view taken along lines 8D—8D, 8E—8E, and 8F—8F shown in FIGS. 8A–8C.
Figures 8E, 8F:
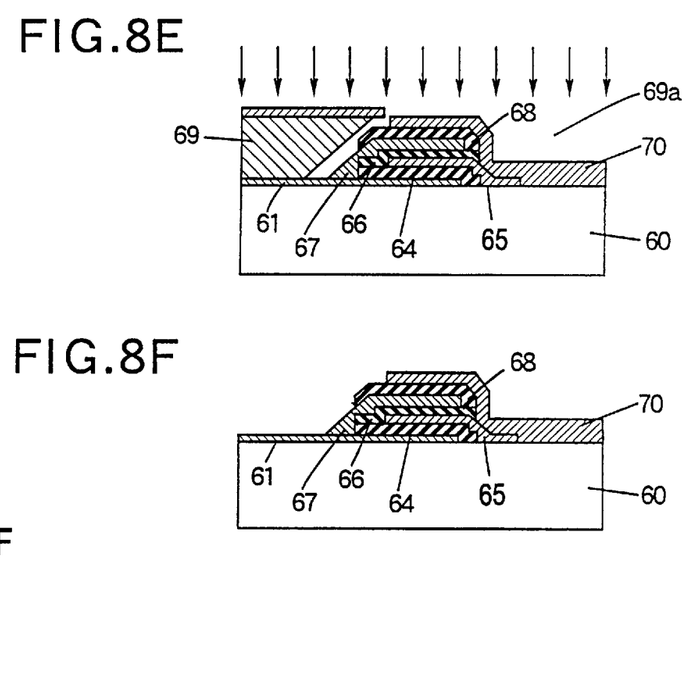

FIGS. 8A–8F are diagrams showing a process for fabricating a capacitor according to the second embodiment, wherein FIGS. 8A–8C show pattern upper surfaces, and FIGS. 8D–8F respectively show cross-sectional view taken along the lines 8D—8D, 8E—8E, and 8F—8F in FIGS. 8A–8C. In the capacitor forming process depicted in FIG. 8, a mask layer 63 (namely, resist pattern 63) is formed using a photoresist of which the pattern edges have an inverted taper shape. A first dielectric layer, second metal electrode layer, second dielectric layer, third metal electrode layer and third dielectric layer are laminated, by using different sputtering angles, on a GaAs substrate 60 (GaAs wafer) on which is formed a first metal electrode layer connected to the drain electrode 6a of the transistor Tr1 of FIG. 7. After removing the resist pattern, a fourth metal electrode layer connected to the gate electrode 8b of the transistor Tr2 of FIG. 7 is laminated. It is assumed that the OF direction of the wafer is situated in the lower part of FIGS. 8A–8C, and in front of the paper for FIGS. 8D–8F.

In FIG. 8A and FIG. 8D, a first metal electrode layer 61 is formed by the steps of sputtering, patterning, and etching or the steps of patterning, sputtering, and lifting-off on a surface of the GaAs substrate 60 (GaAs wafer). This first metal electrode layer 61 is formed so that it is connected to (overlaps with) the drain electrode 6a of the transistor Tr1 of FIG. 7A. The GaAs substrate 60 may, for example, be the same as that of the first embodiment.

Next, a resist pattern 63 (mask layer) having an aperture 63a partly comprising the area of the first metal electrode 61 is formed by patterning using a photoresist of which the pattern edges have an inverted taper shape, It is preferred that the edge taper angle of the resist pattern 63 relative to the wafer surface is 10 degrees to 40 degrees. The aforesaid photoresist may, for example, be the same as that used in the first embodiment.

Next, a dielectric film of a predetermined thickness (e.g., 9000 Å–15000 Å) is formed by vertical sputtering (sputtering incidence angle θ=0 degrees) on the surface of the substrate 60 on which the resist pattern 63 has been formed, thereby forming a first dielectric layer 64 overlapping with the first metal electrode layer 61 in the aperture 63a. This dielectric layer film may, for example, be the same as that used in the first embodiment.

Next, a metal layer is formed by oblique sputtering where the sputtering incidence angle θ lies in a range of 10 degrees to 30 degrees and the sputtering orientation angel φ is 90 degrees, thereby forming the second metal electrode layer 65 in the aperture 63a. This second metal electrode layer 65 overlaps with most of the surface of the first dielectric layer 64 (except for a part of the layer 64 adjacent to the first metal electrode layer 61), but does not overlap with the exposed surface of the first metal electrode layer 61. The second metal electrode layer 65 is therefore electrically isolated from the first metal electrode layer 61.

The first metal electrode layer 61 and the second metal electrode layer 65 may be formed, for example, of Ti/Pt metal as in the first embodiment. Ti film and Pt film are formed respectively to thicknesses of 500 Å and 1000 Å.

Next, a dielectric film is formed by vertical sputtering, and a second dielectric layer 66 is thereby formed in the aperture 63a. This second dielectric layer 66 overlaps with most of the surface of the second metal layer 65 and with the exposed surface of the first dielectric layer 64.

Next, a metal layer is formed by oblique sputtering wherein the sputtering incident angle θ lies in a range of 10 degrees to 30 degrees and the sputtering orientation angle φ is 270 degrees. This third metal electrode layer 67 is formed in the aperture 63a. The third metal electrode layer 67 overlaps with most of the surface of the second dielectric layer 66 and with the exposed surface of the first metal electrode layer 61, but does not overlap with the exposed surface of the second metal electrode layer 65. A dielectric film is also formed by vertical sputtering, a third dielectric layer 68 thereby being formed in the aperture 63a.

Next, in FIG. 8B and FIG. 8E, the resist pattern 63 is lifted off by dissolving it, and another resist pattern 69 having an aperture 69a is formed. This resist pattern 69 is used to form a fourth metal electrode layer 70 (described below), and to connect the fourth metal electrode layer 70 with the gate electrode 8b of the transistor Tr2. The aperture 69a therefore contains an area reaching the gate electrode 8b of the transistor Tr2. The aperture 69a also contains an exposed surface area of the second metal electrode layer 65, but does not contain the exposed surface areas of the first metal electrode layer 61 and third metal electrode layer 67.

Next, a metal layer is formed by vertical sputtering or vapor deposition so as to form the fourth metal electrode layer 70 in the aperture 69a. The fourth metal electrode 70 overlaps with most of the exposed surface of the third dielectric layer 68 and the exposed surface of the second metal electrode layer 65, but does not overlap with the exposed surfaces of the first metal electrode layer 61 and the third metal electrode layer. The fourth metal electrode layer 70 also overlaps with (is connected with) the exposed surface of the gate electrode 8b of the transistor Tr2.

Next, in FIG. 8C and FIG. 8F, the resist pattern 69 is lifted off by dissolving it. In this way, a capacitor having a laminated structure comprising the first metal electrode 61, first dielectric layer 64, second metal electrode layer 65, second dielectric layer 66, third metal electrode layer 67, third dielectric layer 68 and fourth metal electrode 70, is formed. When this capacitor is used as the capacitor C1, the first and third numbered metal electrode layers comprise the first electrode 51a, the second and fourth metal electrode layers comprise the second metal electrode 52a, and the first, second, and third dielectric layers comprise the dielectric 53a.

Hence according to the second embodiment, by giving the capacitor a laminated structure comprising the fourth metal electrode layer and third dielectric layer, the effective surface area S of the capacitor is increased. Specifically, the effective surface area S of the capacitor can be increased by effectively 3 times relative to the pattern occupancy area of the capacitor. The capacitance of the capacitor may therefore be increased by approximately 3 times for the same pattern occupancy area.

Further, by using the resist pattern 63 as a mask in a capacitor forming process wherein the sputtering incidence angle is varied in order to form each film, the first dielectric layer 64, second metal electrode layer 65, second dielectric layer 66 and third metal electrode layer 67 are sequentially formed by sputtering. It is therefore unnecessary to perform sputtering, patterning, etching, and resist removal to form each layer as when the etching method is used, hence the process is simplified.

Moreover, by arranging that the first metal electrode 61 and the fourth metal electrode 70 are connected to an external circuit (transistors Tr1, Tr2 in FIG. 7), the wiring step after forming the inter-layer insulating film can be omitted.

In the capacitor C1, by applying ground potential to the first electrode 51a and a negative potential to the second electrode 52a, the side gate effect of the transistor Tr1 disappears and deterioration of the transistor output is avoided.

In the aforesaid second embodiment, the number of laminated layers of the capacitor was 3, however it will be understood that the number of laminated layers is not limited to this.

Further, connection to an external circuit may be performed also after forming the inter-layer insulating film as in the first embodiment.

An electrically conducting area may also be formed by ion implantation or epitaxial growth techniques in the part of the surface of the GaAs semiconductor substrate 60 where it is desired to form the first metal electrode layer 61, and this electrically conducting area used as the first metal electrode layer.

What is claimed is:

1. A semiconductor device wherein a capacitor is formed on a chemical compound semiconductor substrate, said capacitor comprising:

a first electrode layer;

a first dielectric layer formed on said first electrode layer;

a second electrode layer formed on said first dielectric layer;

a second dielectric layer formed on said second electrode layer; and a third electrode layer formed on said second dielectric layer and having a part extending therefrom to contact said first electrode layer.

2. A semiconductor device of claim 1, wherein said capacitor has a function of removing a D.C. component current.

3. A semiconductor device of claim 1, further comprising a first transistor and a second transistor each formed on said semiconductor substrate:

wherein one end of said first electrode layer is electrically connected to said first transistor, and one end of said second electrode layer is electrically connected to said second transistor.

4. A semiconductor device of claim 3, wherein said one end of said first electrode layer is electrically connected to a drain of said first transistor, and said one end of said second electrode layer is electrically connected to a gate of said second transistor.

5. A semiconductor device of claim 4, wherein a ground potential is applied to said first electrode layer, and a negative potential is applied to said second electrode layer.

6. A semiconductor device of claim 1, wherein:

said chemical compound semiconductor is a GaAs substrate; and said dielectric layer is selected from the group consisting of a silicon nitride film, a tantalum oxide film, BST and STO.

7. A semiconductor device of claim 1, wherein said third electrode layer is a laminated layer including a layer of titanium and a layer of platinum.

8. A semiconductor device of claim 1, wherein said second dielectric layer has a part extending therefrom to contact said first dielectric layer.

9. A semiconductor device of claim 1, further comprising:

a third dielectric layer formed on said third electrode layer; and a fourth electrode layer formed on said third dielectric layer and having a part extending therefrom to contact said second electrode layer.

10. A semiconductor device of claim 9, wherein said second dielectric layer has a part extending therefrom to contact said first dielectric layer, and wherein said third dielectric layer has a part extending therefrom to contact said second dielectric layer.

11. A semiconductor device wherein a capacitor, a first transistor having a drain, and a second transistor having a gate are formed on a chemical compound semiconductor substrate, said capacitor comprising:

a first electrode layer electrically connected to the drain of said first transistor;

a dielectric layer formed on said first electrode layer; and a second electrode layer formed on said dielectric layer and electrically connected to the gate of said second transistor.

12. A semiconductor device of claim 11, wherein a ground potential is applied to said first electrode layer, and a negative potential is applied to said second electrode layer.

* * * * *